(12) United States Patent
Ball

(10) Patent No.: US 7,504,590 B2
(45) Date of Patent: Mar. 17, 2009

(54) EMI SHIELDING GASKETS

(75) Inventor: Shelby Ball, Frisco, TX (US)

(73) Assignee: Laird Technologies, Inc., Chesterfield, MO (US)

( * ) Notice: Subject to any disclaimer, the term of this patent is extended or adjusted under 35 U.S.C. 154(b) by 82 days.

(21) Appl. No.: 11/634,577

(22) Filed: Dec. 6, 2006

(65) Prior Publication Data

US 2008/0137320 A1 Jun. 12, 2008

(51) Int. Cl.
*H05K 9/00* (2006.01)
(52) U.S. Cl. .................. 174/354; 174/355; 174/369
(58) Field of Classification Search .......... 174/354, 174/355, 369; 361/816, 818
See application file for complete search history.

(56) References Cited

U.S. PATENT DOCUMENTS

| | | | |
|---|---|---|---|
| 4,797,007 A | 1/1989 | Elmore, III | |
| 4,857,668 A | 8/1989 | Buonanno | |
| 5,250,751 A | 10/1993 | Yamaguchi | |
| 5,524,908 A | 6/1996 | Reis | |
| 5,576,513 A * | 11/1996 | Gunther et al. | ............. 174/372 |
| 5,957,465 A | 9/1999 | Gonsalves et al. | |
| 6,239,359 B1 | 5/2001 | Lilienthal, II et al. | |
| 6,259,609 B1 | 7/2001 | Kurz | |
| 6,280,257 B1 | 8/2001 | North et al. | |
| 6,574,121 B1 | 6/2003 | Franz et al. | |
| 6,701,774 B2 | 3/2004 | Srinivasan et al. | |
| 2003/0201611 A1 | 10/2003 | Schenk | |

FOREIGN PATENT DOCUMENTS

JP 2001-202933 * 7/2001

* cited by examiner

*Primary Examiner*—Hung V Ngo
(74) *Attorney, Agent, or Firm*—Harness, Dickey & Pierce, P.L.C.

(57) ABSTRACT

An exemplary embodiment of a gasket is configured for providing electromagnetic interference (EMI) shielding and/or grounding of one or more electrical components on a substrate disposed within a passageway of a member having a generally circular cross-section. The gasket may include inner and outer portions that cooperatively define a generally circular annular shape with a generally central opening. The outer portion may be configured to be disposed circumferentially along and in electrical contact with an electrically-conductive surface of the member in a first direction. The inner portion may be configured to be disposed circumferentially along an edge portion of the substrate and in electrical contact with at least one electrically-conductive portion on the substrate in a second direction generally perpendicular to the first direction. Accordingly, the gasket may establish electrical grounding contact from the at least one electrically-conductive portion on the substrate to the member.

20 Claims, 14 Drawing Sheets

EMI SHIELDING GASKETS

FIELD

The present disclosure generally relates to electromagnetic interference (EMI)/radio frequency interference (RFI) shielding gaskets.

BACKGROUND

The statements in this section merely provide background information related to the present disclosure and may not constitute prior art.

Electronic equipment typically includes electrical components and circuits mounted on a substrate that may be sensitive to electromagnetic interference (EMI) and/or radio frequency interference (RFI). EMI/RFI interference may originate from internal sources within the electronic equipment or from external EMI/RFI interference sources. Interference may cause degradation or complete loss of important signals, thereby rendering the electronic equipment inefficient or inoperable. Accordingly, the circuits (sometimes referred to as RF modules or transceiver circuits) are usually provided with EMI/RFI shielding in order to function properly. Such shielding is intended to reduce interference not only from external sources, but also from various functional blocks within the module. By way of example, electronic circuits or components of a printed circuit board (PCB) are often enclosed with shields to localize EMI within its source, and to insulate other devices proximal to the EMI source. In addition, the shielding devices may also be electrically grounded to allow offending electrical charges and fields to be dissipated without disrupting the operation of the electrical components enclosed by the shielding devices.

As used herein, the term "EMI" should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to a housing or other enclosure in which electronic equipment is disposed.

SUMMARY

According to various aspects, exemplary embodiments are provided of devices that may be used for providing shielding and/or grounding for electrical components on a substrate. In one exemplary embodiment, a gasket is configured for providing electromagnetic interference (EMI) shielding and/or grounding of one or more electrical components on a substrate disposed within a passageway of a member having a generally circular cross-section. The gasket may include inner and outer portions that cooperatively define a generally circular annular shape with a generally central opening. The outer portion may be configured to be disposed circumferentially along and in electrical contact with an electrically-conductive surface of the member in a first direction. The inner portion may be configured to be disposed circumferentially along an edge portion of the substrate and in electrical contact with at least one electrically-conductive portion on the substrate in a second direction generally perpendicular to the first direction. Accordingly, the gasket may thus establish electrical grounding contact from the at least one electrically-conductive portion on the substrate to the member sufficient for EMI shielding applications.

In another exemplary embodiment, an assembly is provided that may be used for providing EMI shielding and/or grounding for one or more electrical components on a generally circular PCB associated with a gas chromatography unit. The PCB may be disposed within a passageway or interior space defined by a casting or other component of the gas chromatography device. The passageway or interior space may be defined by an electrically-conductive interior surface of the casting such that the passageway has a generally circular cross-section. The EMI shielding and/or grounding assembly may include a gasket and a washer. The gasket may include latch members that are engageable within corresponding openings of the washer, to thereby attach the gasket to the washer. The gasket may also include inner and outer portions that cooperatively define a generally circular annular shape with a generally central opening through which at least a portion of the PCB may be accessible. The gasket's outer portion may be disposed circumferentially along and in electrical contact with the electrically-conductive interior surface of the casting in a radial direction. The gasket's inner portion may be disposed circumferentially along an edge portion of the PCB and in electrical contact with at least one electrically-conductive portion on the PCB in an axial direction generally perpendicular to the radial direction. The washer may include fastener holes for receiving fasteners for attaching the washer to the casting. The direction in which the fastener holes receive the fasteners may be in an axial direction generally perpendicular to the radial direction.

Additional aspects relate to methods of for providing EMI shielding and/or grounding for one or more electrical components on a printed circuit board (PCB) within a passageway having a generally circular cross-section as defined by an electrically-conductive interior surface of a member. In one exemplary embodiment, a method generally includes positioning a gasket within the passageway relative to the PCB such that resilient finger elements of the gasket electrically contact the member's electrically-conductive interior surface in a first direction, and such that an inner portion of the gasket electrically contacts at least one electrically-conductive portion on the PCB in a second direction generally perpendicular to the first direction. Accordingly, the gasket may thus establish electrical grounding contact from the at least one electrically-conductive portion on the PCB to the casting sufficient for EMI shielding applications.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

Figure 12:
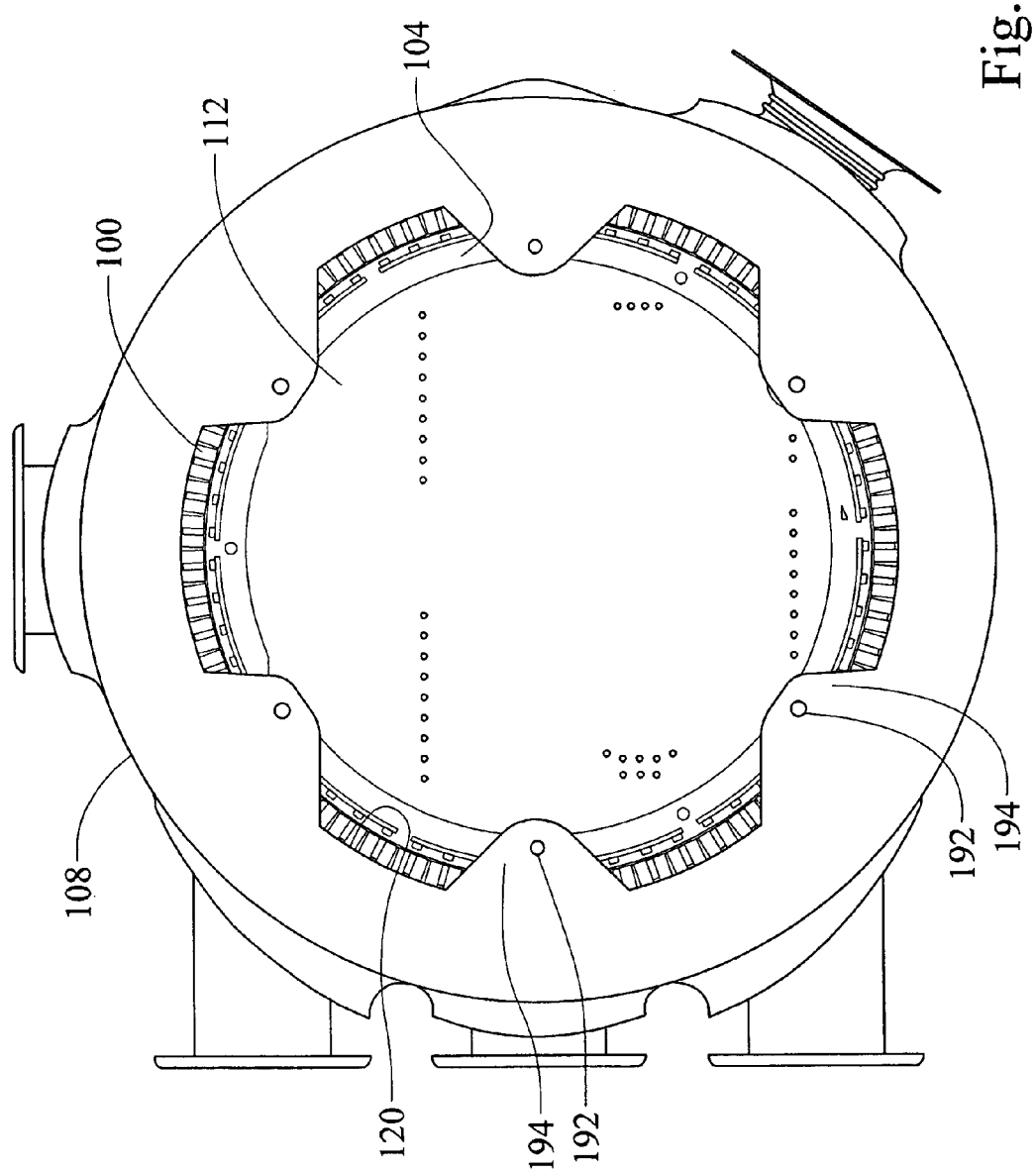
FIG. 12 is a view illustrating the gasket and washer combination shown in FIG. 8 installed for providing EMI shielding and/or grounding for one or more electrical components of a PCB disposed within a passageway of a component of a gas chromatography device according to exemplary embodiments.
Figure 13:
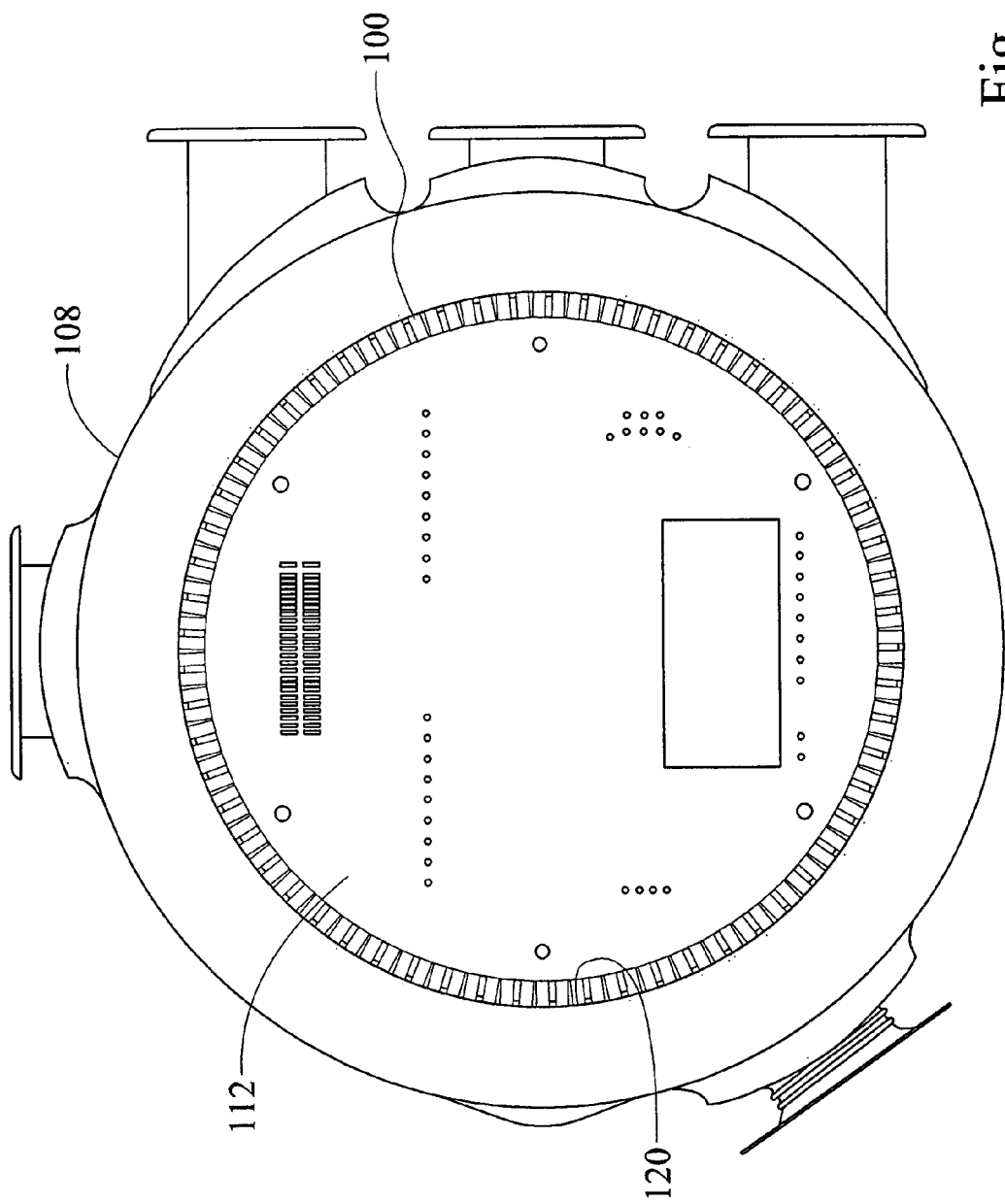
Figure 14:
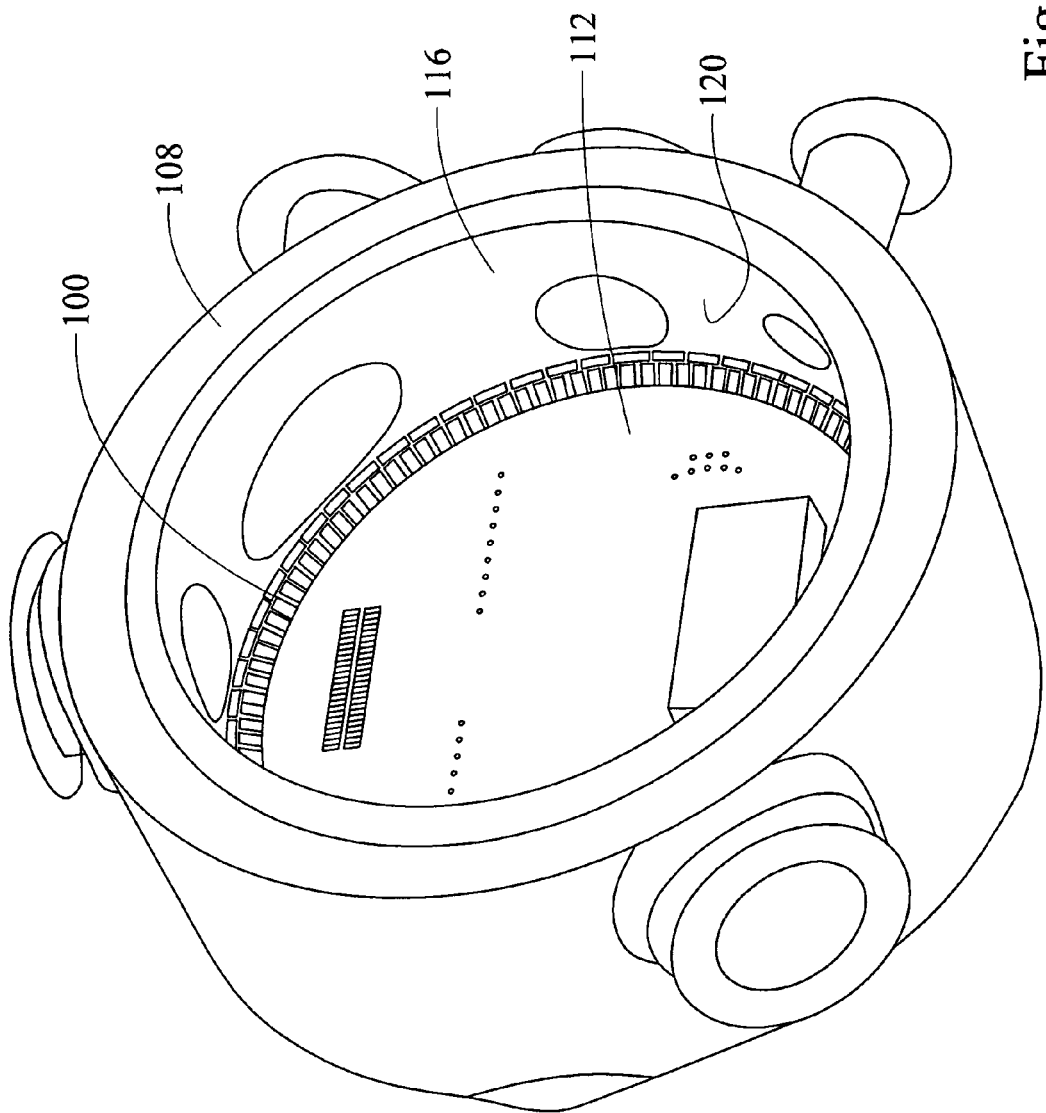

FIG. 13 is a rear view of the gasket and washer combination, PCB, and component of the gas chromatography device shown in FIG. 12; and FIG. 14 is a perspective view of the gasket and washer combination, PCB, and component of the gas chromatography device shown in FIG. 13, and illustrating the gasket in electrical contact with at least one electrically-conductive portion of the PCB and the component's electrically-conductive surface thereby establish electrical grounding contact therebetween sufficient for EMI shielding applications.

DETAILED DESCRIPTION

The following description is merely exemplary in nature and is in no way intended to limit the present disclosure, application, or uses. It should be understood that throughout the drawings, corresponding reference numerals indicate like or corresponding parts and features.

Various embodiments provide devices that may be used for providing EMI shielding and/or grounding for electrical components on one or both sides of a substrate, such as a printed circuit board (PCB). For example, a gasket disclosed herein may be used to establish electrical grounding contact from at least one electrically-conductive portion (e.g., trace, etc.) on a PCB to an electrically-conductive interior surface of a tubular product, pipe, casting, component associated with a gas chromatography unit, etc.

In one exemplary embodiment, a gasket is configured for providing electromagnetic interference (EMI) shielding and/or grounding of one or more electrical components on a substrate disposed within a passageway of a member having a generally circular cross-section. The gasket may include inner and outer portions that cooperatively define a generally circular annular shape with a generally central opening. The outer portion may be configured to be disposed circumferentially along and in electrical contact with an electrically-conductive surface of the member in a first direction. The inner portion may be configured to be disposed circumferentially along an edge portion of the substrate and in electrical contact with at least one electrically-conductive portion on the substrate in a second direction generally perpendicular to the first direction. Accordingly, the gasket may thus establish electrical grounding contact from the at least one electrically-conductive portion on the substrate to the member sufficient for EMI shielding applications.

In another exemplary embodiment, an assembly is provided that may be used for providing EMI shielding and/or grounding for one or more electrical components on a generally circular PCB associated with a gas chromatography unit. The PCB may be disposed within a passageway or interior space defined by a casting or other component of the gas chromatography device. The passageway or interior space may be defined by an electrically-conductive interior surface of the casting such that the passageway has a generally circular cross-section. Continuing with this example, the EMI shielding and/or grounding assembly may include a gasket and a washer. The gasket may include latch members (e.g., arrow-shaped latches, protrusions, hook members, tabs, etc.) that are engageable within corresponding openings (e.g., slots, holes, etc.) of the washer, to thereby attach the gasket to the washer. The gasket may also include inner and outer portions that cooperatively define a generally circular annular shape with a generally central opening through which at least a portion of the PCB may be accessible. The gasket may be installed such that its outer portion is disposed circumferentially along and in electrical contact with the electrically-conductive interior surface of the casting in a radial, and such that the gasket's inner portion is disposed circumferentially along an edge portion of the PCB and in electrical contact with at least one electrically-conductive portion on the PCB in an axial direction generally perpendicular to the radial direction. The washer may include fastener holes for receiving fasteners (e.g., screws, nut-and-bolt assemblies, etc.) for attaching the washer to the casting. The direction in which the fastener holes receive the fasteners may be in an axial direction generally perpendicular to the radial direction.

Additional aspects relate to methods of for providing EMI shielding and/or grounding for one or more electrical components on a printed circuit board (PCB) within a passageway having a generally circular cross-section as defined by an electrically-conductive interior surface of a member. In one exemplary embodiment, a method generally includes positioning a gasket within the passageway relative to the PCB such that resilient finger elements of the gasket electrically contact the member's electrically-conductive interior surface in a first direction, and such that an inner portion of the gasket electrically contacts at least one electrically-conductive portion on the PCB in a second direction generally perpendicular to the first direction. Accordingly, the gasket may thus establish electrical grounding contact from the at least one electrically-conductive portion on the PCB to the member sufficient for EMI shielding applications.

FIGS. 1 through 4 illustrate a gasket 100 embodying aspects of the present disclosure. As disclosed herein, the gasket 100 may be mounted to a mounting component (e.g., washer 104 shown in FIGS. 6 and 7, etc.). In turn, the washer 104 (or other suitable mounting means) may then be mounted to another device (e.g., casting 108 shown in FIGS. 12 through 14, etc.). The installed gasket 100 may provide EMI shielding and/or grounding of one or more electrical components on a substrate (e.g., PCB 112 shown in FIGS. 16 through 18, etc.).

As shown in FIGS. 12 through 14, a generally circular PCB 112 is positioned within a passageway or interior space 116. The passageway 116 has a generally circular cross-section as defined by an electrically-conductive surface 120 of the casting 108. As disclosed herein, the gasket 100 has a unique construction that provides the gasket 100 with great flexibility, such that the gasket 100 may be assembled into a generally circular annular shape. This allows the gasket 100 to be positioned with its outer portion 124 disposed circumferentially along and in electrical contact with the electrically-conductive surface 120 in a first direction (e.g., in a radial direction relative to the casting's generally circular cross-section shown in FIGS. 16 and 17), and with the gasket's inner portion 132 disposed circumferentially along an edge portion of the PCB 112 and in electrical contact with at least one electrically-conductive portion on the substrate in a second direction generally perpendicular to the first direction. In FIGS. 16 and 17, the second direction comprises an axial direction (into or out of the page) relative to the casting's generally circular cross-section shown in FIGS. 16 and 17. Accordingly, the gasket 100 may thus establish electrical grounding contact from at least one electrically-conductive portion (e.g., ground traces, etc.) on the PCB 112 to the casting 108 sufficient for EMI shielding applications. Alternatively, gaskets disclosed herein may be used with other substrates (e.g., non-circular PCBs, etc.), with non-circular passageways, and/or used with other devices besides castings and gas chromatography devices.

With continued reference to FIGS. 1 through 4, the gasket 100 will now be described in further detail. As shown, the inner and outer portions 132 and 124 cooperatively define a generally circular annular shape with a generally central opening 140. In some embodiments, the opening 140 may be configured (e.g., sized, shaped, positioned, etc.) to allow access therethrough to the PCB and electrical components thereon being shielded and/or grounded by the gasket 100.

The inner portion 132 of the gasket 100 is crenulated such that the inner portion 132 varies in height relative to the gasket's outer portion 124. This crenulated feature may also be seen in FIG. 5.

Figure 6:
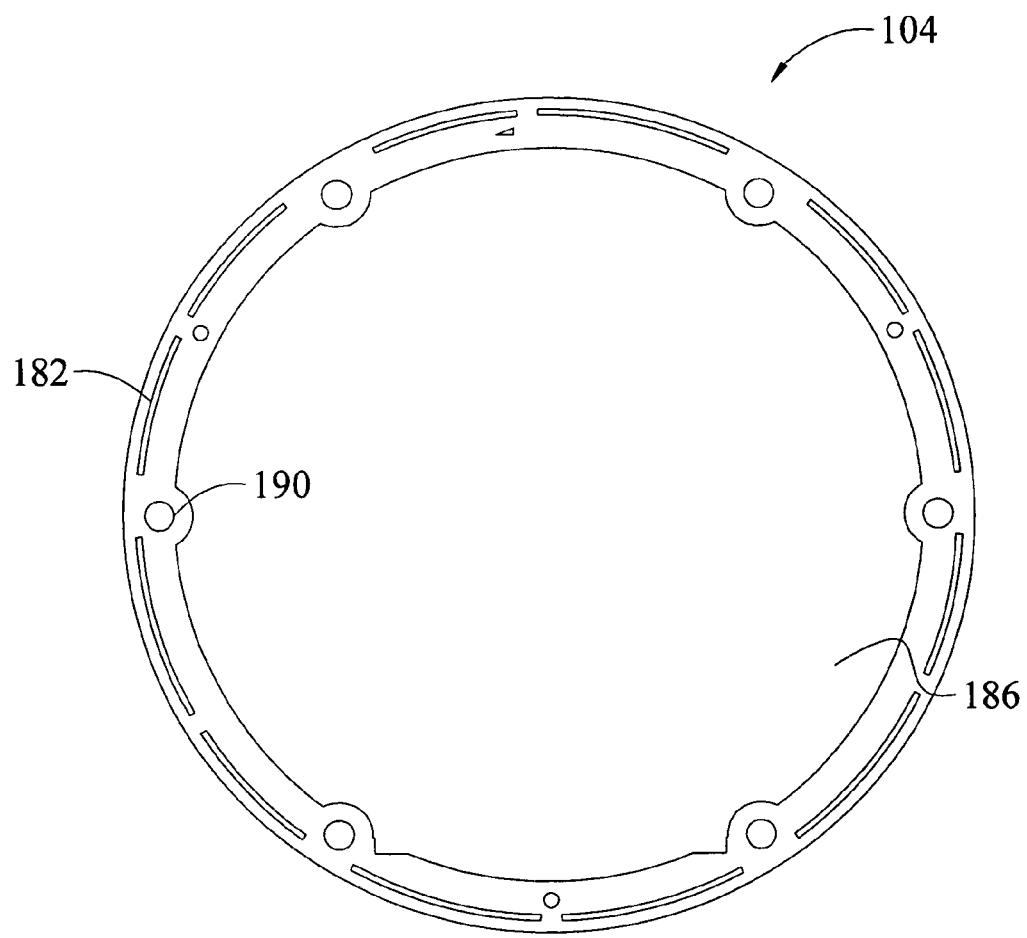
FIG. 6 is a front view of an exemplary washer to which the gasket shown in FIG. 1 may be mounted according to exemplary embodiments.

The gasket 100 may also include slots or slits 144 defining resilient finger elements 148. In this particular embodiment, the finger elements 148 include contact portions 152 for electrically contacting the casting's electrically-conductive surface 120 at corresponding circumferentially-spaced apart locations. As shown in FIG. 6, the contact portions 152 have an arcuate transverse profile.

Figure 1:
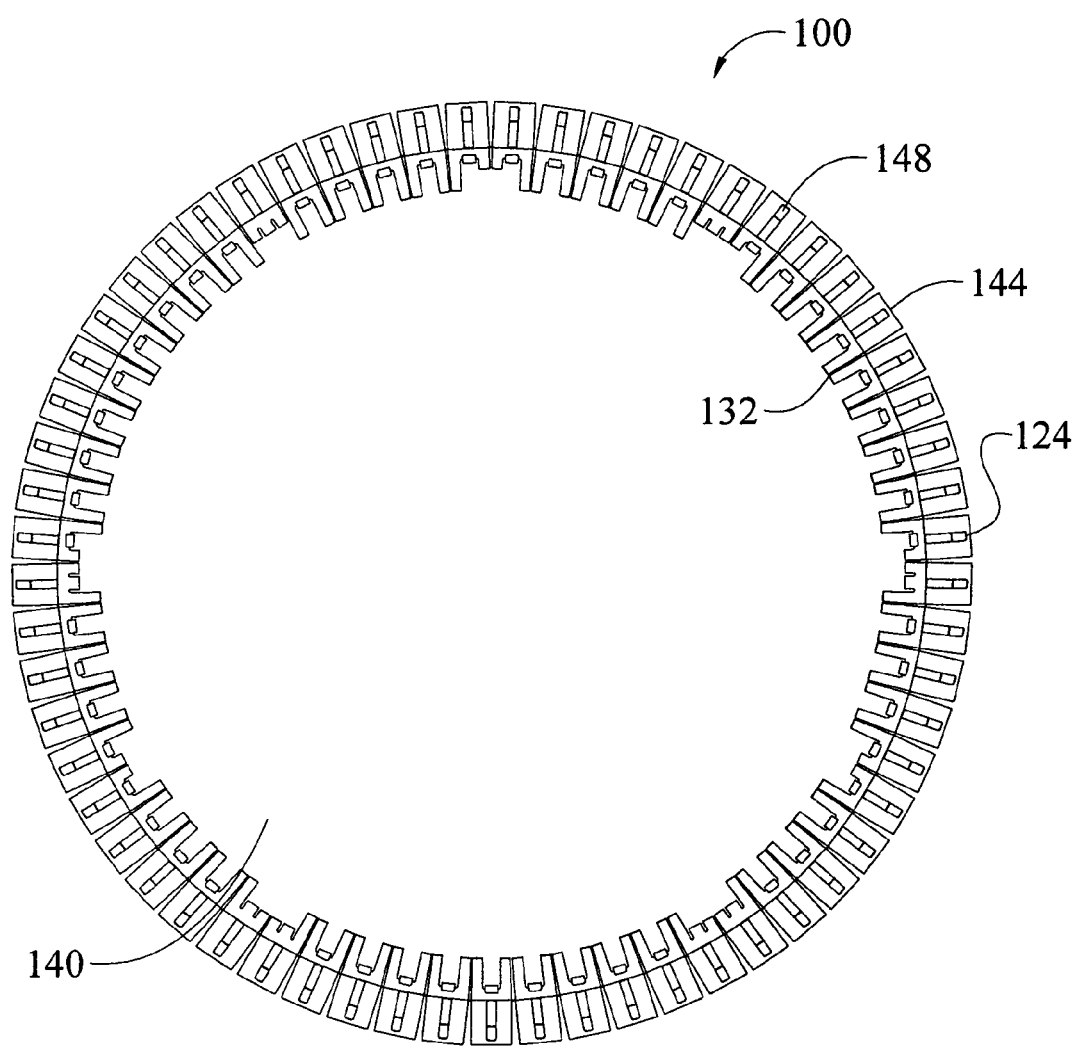
FIG. 1 is a front view of a gasket that may be used for providing EMI shielding and/or grounding for electrical components on a substrate according to exemplary embodiments.
Figure 2:
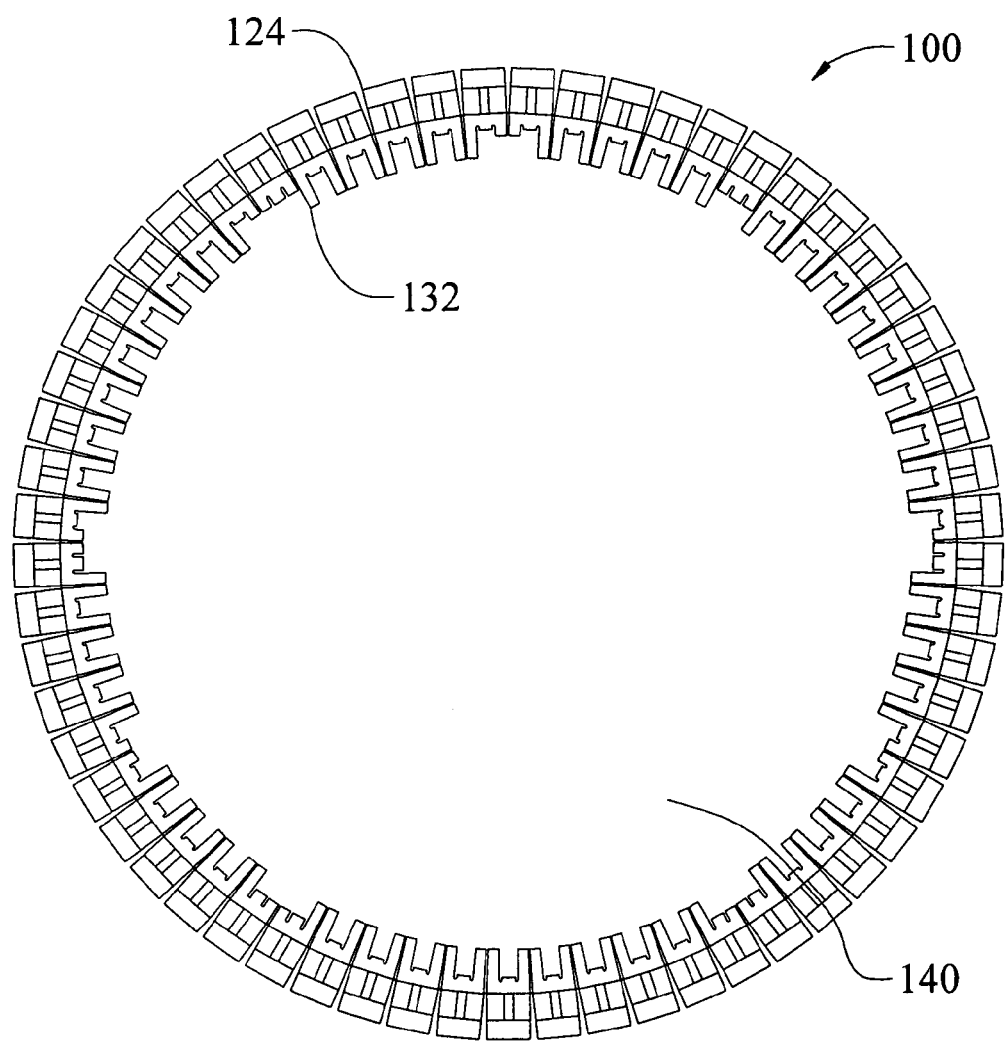
FIG. 2 is a rear view of the gasket shown in FIG. 1.
Figure 3:
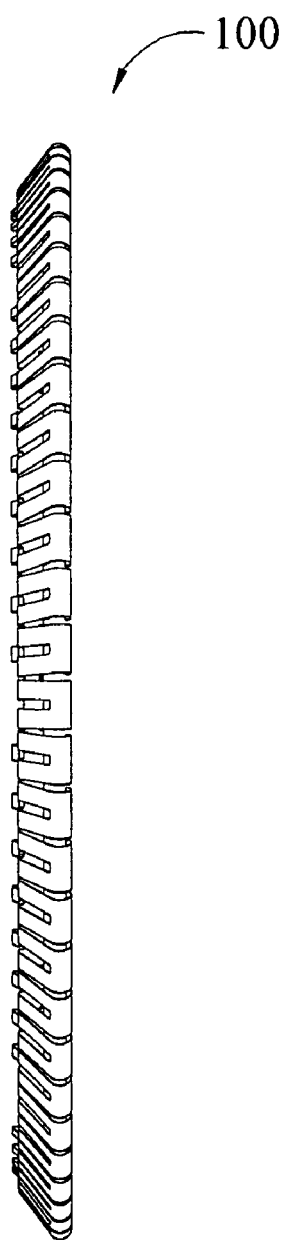
FIG. 3 is a side elevation view of gasket shown in FIG. 1.
Figure 4:
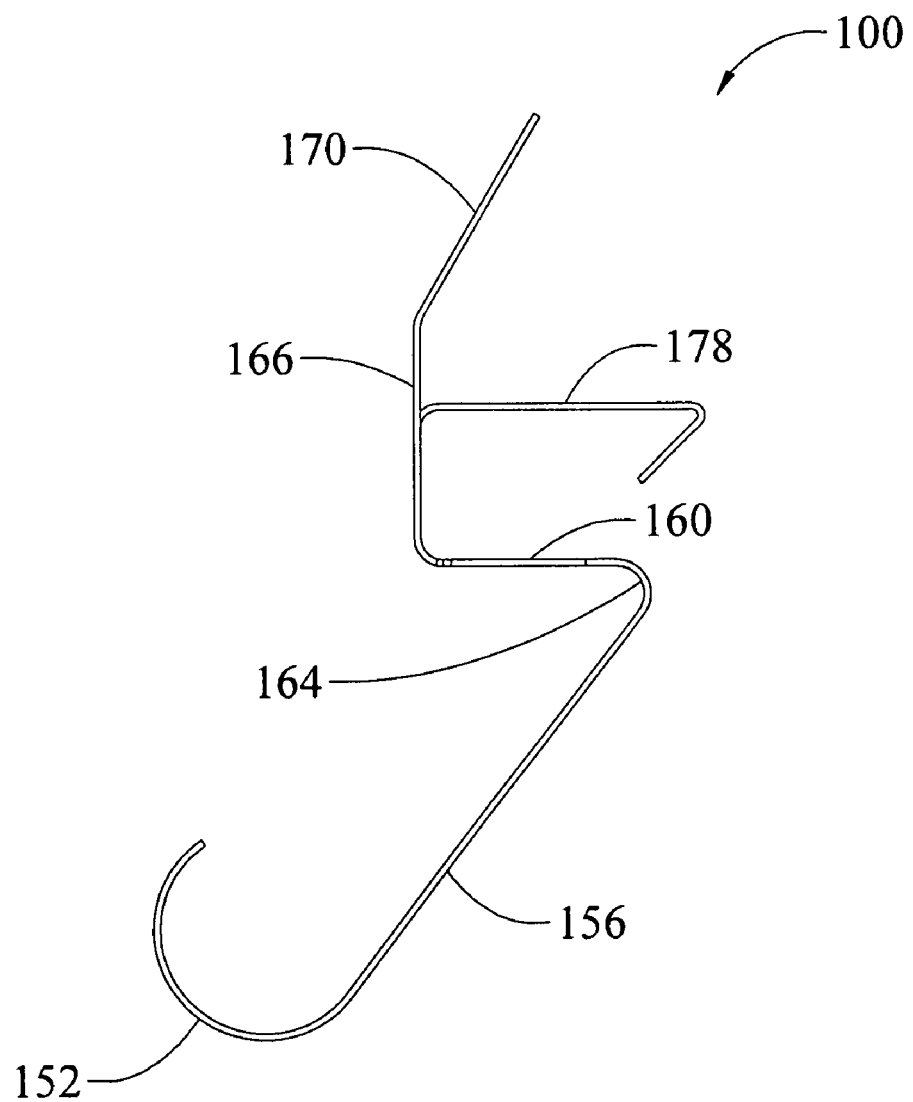
FIG. 4 is a cross-sectional side view of the gasket shown in FIG. 1.

FIG. 4 illustrates an exemplary profile for the gasket 100. As shown, the gasket profile includes an arcuate contact portion 152 defined by the finger element 148. The gasket profile also includes a first slanted portion 156 extending from the arcuate contact portion 152. A first generally flat portion 160 extends from the first slanted portion 156 such that an acute angle 164 is defined generally between the first slanted portion 156 and the first generally flat portion 160. The gasket profile further includes a second generally flat portion 166 extending generally perpendicularly from the first generally flat portion 160. A second slanted portion 170 extends from the second generally flat portion 166 such that an obtuse angle is defined generally therebetween. The gasket 100 also includes an engagement portion 178 (e.g., latches, arrow-shaped latches, protrusions, hook members, tabs, etc.), which extends outwardly from the second generally flat portion 166 intermediate the first generally flat portion 160 and the second slanted portion 170.

The engagement portion 178 is configured for engaging a corresponding opening 182 of a mounting component 104. In this particular embodiment, the gasket 100 includes generally arrow-shaped latch members 178 that are circumferentially spaced-apart along the gasket 100. The latch members 178 are configured to be engagingly received and retained within corresponding circumferentially spaced-apart openings 182 of the washer 104. As shown in FIGS. 8 through 11, the gasket 100 may thus be attached to the washer 104 by engaging the latch members 178 with the washer's openings or slots 182. Alternatively, other embodiments may include a gasket that is used with other mounting means besides the washer 104.

Figure 7:
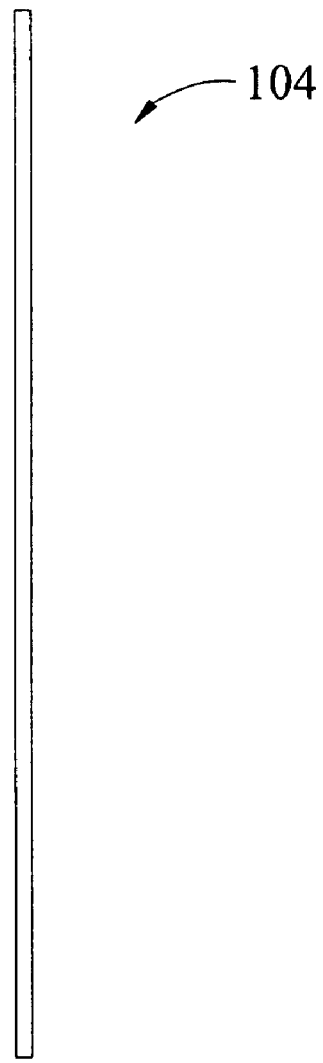
FIG. 7 is a side elevation view of the washer shown in FIG. 6.
Figure 8:
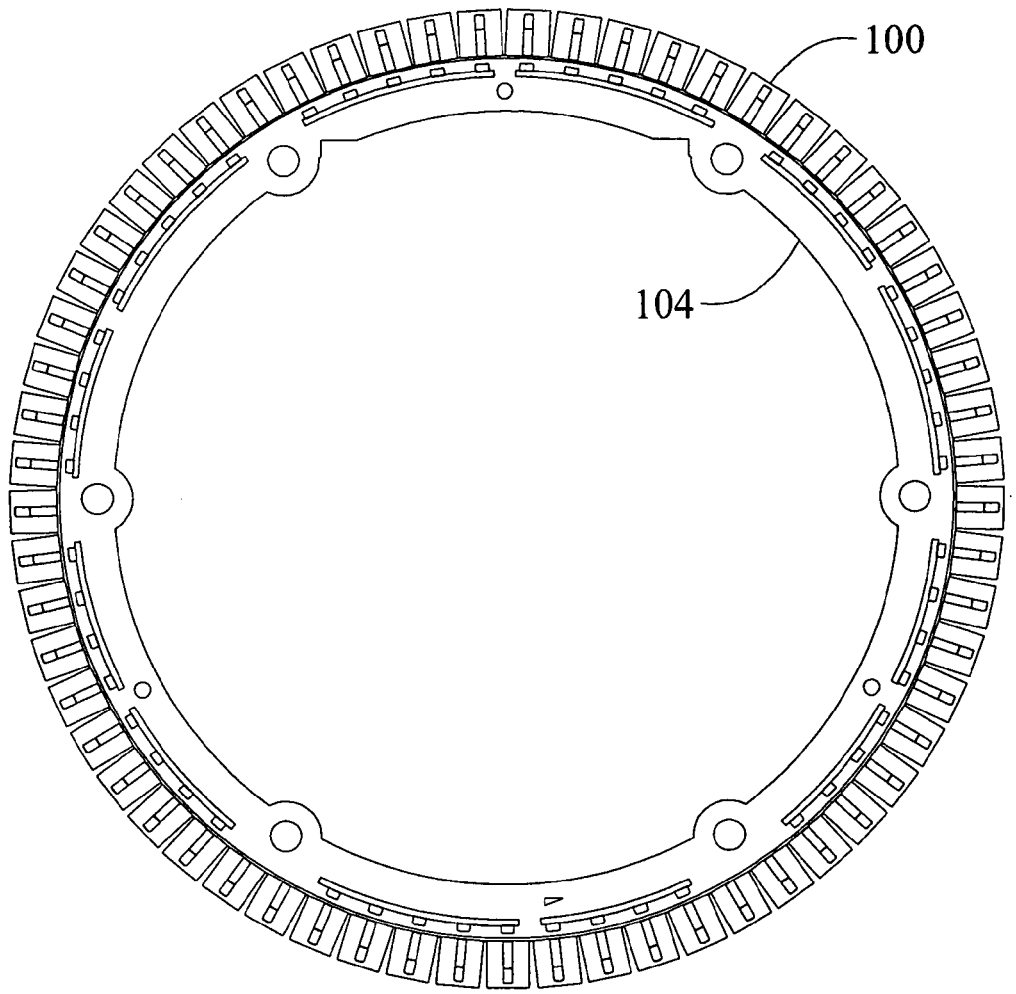
FIG. 8 is a front view illustrating the gasket shown in FIG. 1 mounted to the washer shown in FIG. 6 according to exemplary embodiments.
Figure 9:
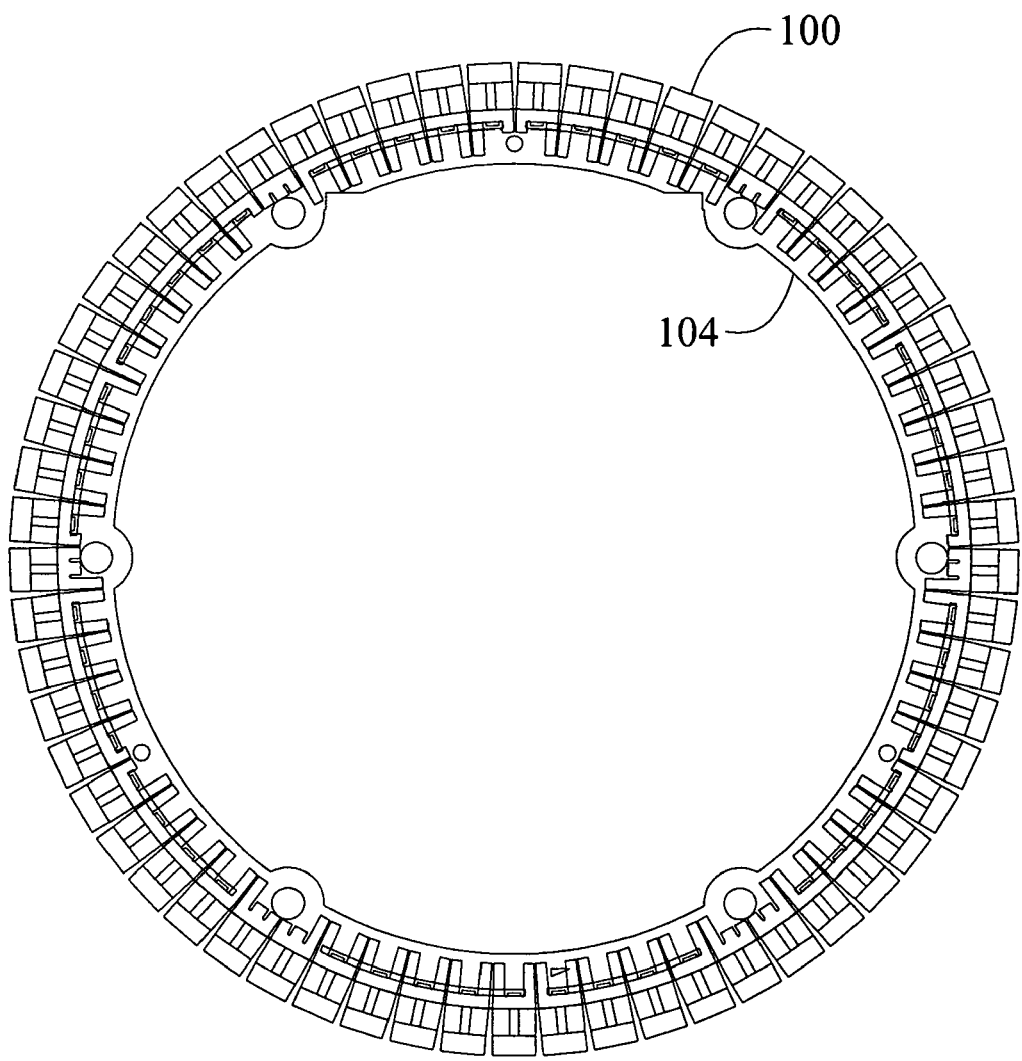
FIG. 9 is a rear view of the gasket and washer combination shown in FIG. 8.
Figure 10:
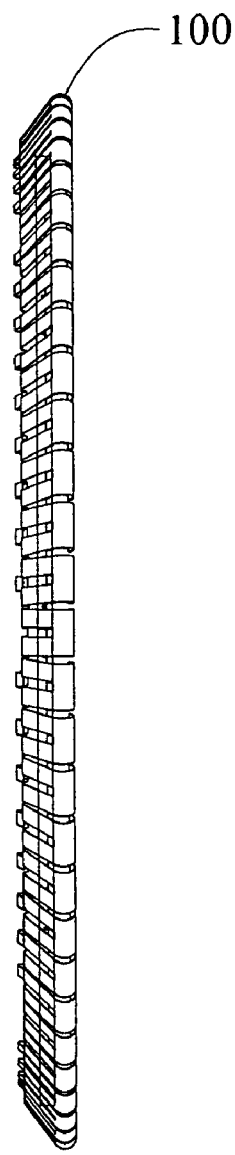
FIG. 10 is a side elevation view of the gasket and washer combination shown in FIG. 8.

With reference now to FIGS. 6 and 7, the washer 104 is generally circular with a generally central opening 186. In some embodiments, the opening 186 may be configured (e.g., sized, shaped, positioned, etc.) to allow access therethrough to the PCB and electrical components thereon being shielded and/or grounded by the gasket 100. Alternatively, other embodiments may include a washer or other mounting means having a different configuration than what is shown in the figures.

The washer 104 includes fastener holes 190. In this particular embodiment, the pattern of the washer's fastener holes 190 correspond with the pattern of the fastener holes 192 associated with the casting's flange portions or ears 194, as shown by FIG. 12. Accordingly, the fasteners (not shown) may be inserted through the washer's fastener holes 190 and casting's fastener holes 192 for attaching the washer 104 to the casting 108. For this illustrated embodiment, the direction in which the fastener holes 190 and 192 receive the fasteners is generally perpendicular to the direction in which the gasket's outer portion 124 electrically contacts the casting's electrically-conductive interior surface 120. With reference to FIG. 12, the fastener holes 190 and 192 receive the fasteners in an axial direction (into or out of the page) relative to the circular cross-section of the passageway 116.

Figure 11:
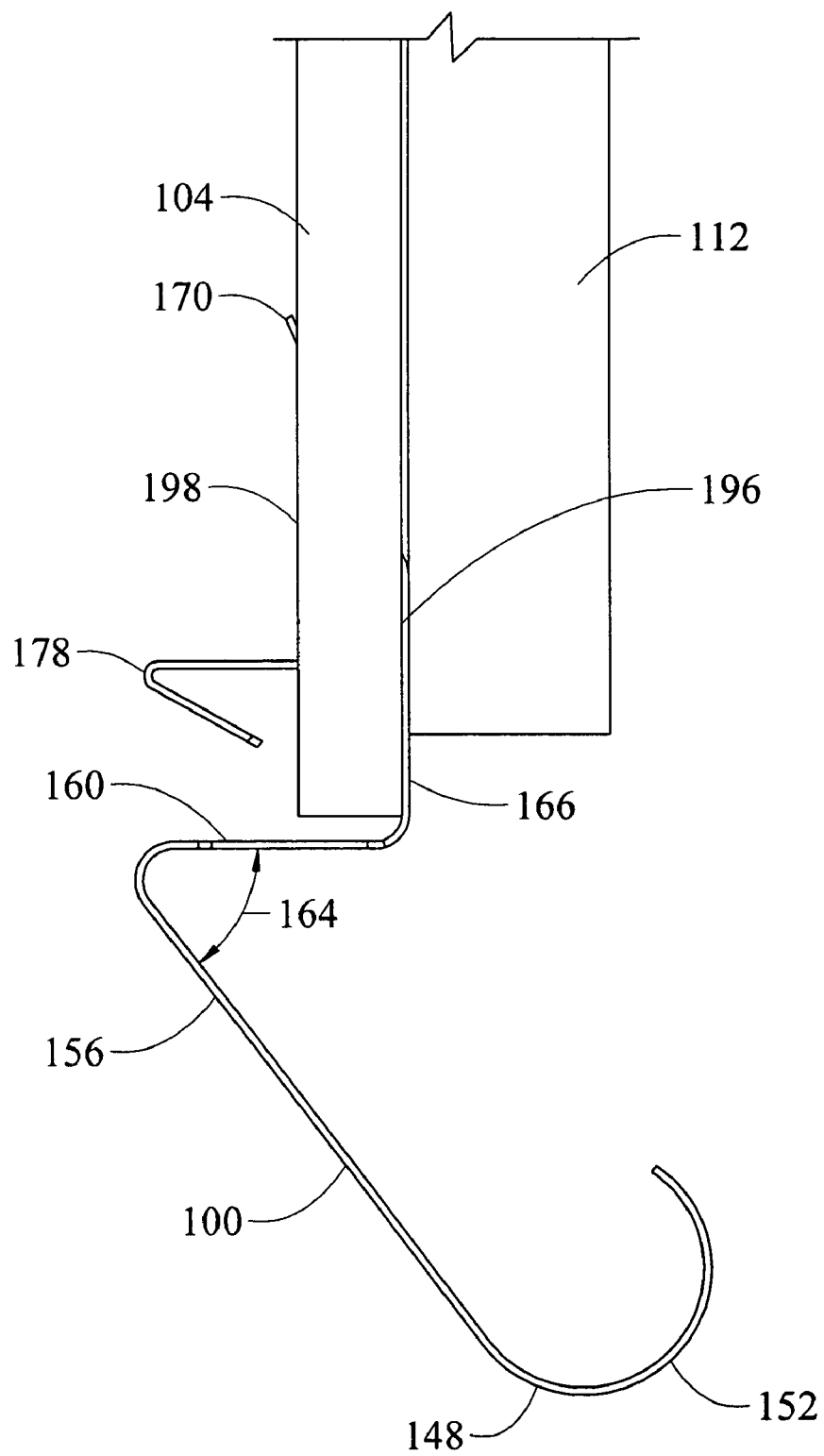
FIG. 11 is a partial cross-sectional side view of the gasket and washer combination shown in FIG. 8 and illustrating the latching mechanism by which the gasket is mounted to the washer according to exemplary embodiments.

FIG. 11 is a partial cross-sectional side view showing the gasket 100, washer 104, PCB 112, and one of the latch members 178 by which the gasket 100 may be attached to the washer 104. The relative sizing of the components shown in FIG. 11 is merely exemplary and provided for purposes of illustration only. In other embodiments, the sizing of one or more of the components relative to the other components may be varied as understood by those skilled in the art. With further regard to this relative sizing, some embodiments are configured such that the component relative sizing is substantially identical to what is shown in FIG. 11, and such that the PCB 112 has a thickness between about 0.085 inches and about 0.100 inches (about 2.159 millimeters and about 2.540 millimeters). The dimensions provided in this paragraph (as are all dimensions disclosed herein) are for purposes of illustration only and not for purposes of limitation.

As shown in FIG. 11, the gasket's arcuate contact portion 152 is disposed along a first side 196 of the washer 104. The gasket's first slanted portion 156 extends from the arcuate contact portion 152 from a position located on the first side 196 of the washer 104 to a position located on the second side 198 of the washer 104. The gasket's first generally flat portion 160 extends from the first slanted portion 156 from a position located on the washer's second side 198 to a position located on the washer's first side 196. The gasket's second generally flat portion 166 extends generally perpendicularly from the first generally flat portion 160 for interposition and between the PCB 112 and the washer 104. The gasket's flat portion 166 may also electrically contact one or more electrically-conductive portions of the PCB 112.

Figure 5:
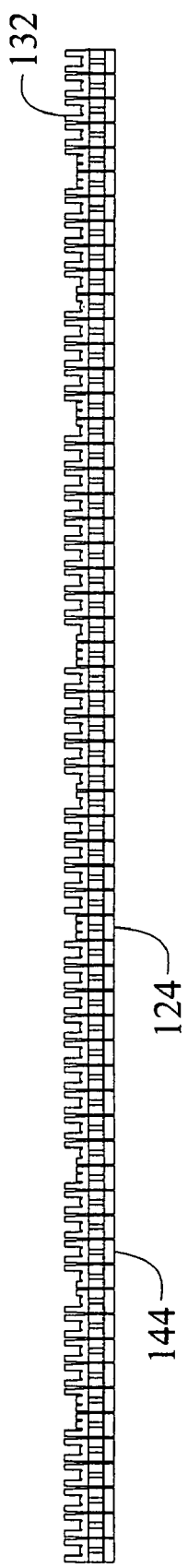
FIG. 5 is a plan view of a blank prior to forming the blank into the gasket shown in FIG. 1 according to exemplary embodiments.

In various embodiments, the gasket 100 may be integrally or monolithically formed as a single component. For example, FIG. 5 illustrates a piece of material having a flat pattern that may be used for making the gasket 100. As shown in the figures, the gasket 100 includes a plurality of slots or slits 144 that define finger elements 148. The gasket 100 also includes a crenulated inner portion 132 varying in height relative to the outer portion 124. Accordingly, this particular embodiment of the gasket 100 may be formed by stamping the slots 144 and the crenulated inner portion 132 into a piece of material. After stamping this flat pattern (FIG. 5) in the piece of material, the material may be folded, bent, or otherwise formed to provide the gasket 100 with a transverse cross-sectional profile as shown in FIG. 4.

Even though the gasket 100 may be formed integrally in this example, such is not required for all embodiments. For example, other embodiments may include the latching members being formed as discrete components that are separately attached to the gasket, for example, by welding, adhesives, among other suitable methods. Alternative configurations (e.g., shapes, sizes, etc.), materials, and manufacturing methods (e.g., drawing, etc.) may be used for making the gasket 100.

A wide range of materials, preferably resiliently flexible and electrically-conductive, may be used for a gasket (e.g., 100, etc.) disclosed herein. In various embodiments, the gasket 100 is formed from resiliently flexible material that is elastic in nature with a modulus of elasticity sufficient so that the gasket 100 and/or the finger elements 148 thereof may be displaced by a force from an unloaded position to a loaded position, and then return to the unloaded position upon the removal of this force without exceeding the yield point of the material. In some embodiments, the gasket 100 is formed from a sufficiently elastic material that allows the gasket 100 to be assembled from a flat configuration (e.g., FIG. 5, etc.) into a generally circular annular shape (e.g., FIGS. 1 and 2, etc.) multiple times in the field. Additionally, or alternatively, the gasket in some embodiments may be formed from an electrically-conductive material capable of conducting electricity with impedance low enough to be an effective EMI/RFI shield.

By way of further example, some embodiments include a gasket formed from a beryllium copper alloy (e.g., 0.0035 inches thick beryllium copper alloy 25 ¼ hard, etc.) or stainless steel. The beryllium copper alloy may include between about 1.8% (weight) and about 2.0% (weight) beryllium, a maximum of about 0.6% (weight) of the combination of cobalt, nickel, and iron, and the balance copper, which alloy has an electrical conductivity of between about 22% and about 28% IACS (International Annealed Copper Standard). An example of a suitable alloy is available from Brush Wellman, Cleveland, Ohio, as Brush Alloy 25 (copper alloy UNS number C17200). Other suitable materials may also be used such as phosphor bronze, copper-clad steel, brass, monel, aluminum, steel, nickel silver, other beryllium copper alloys, among others. Furthermore, the material may optionally be pre-plated or post-plated for galvanic compatibility with the surface on which it is intended to be mounted. Alternatively, the material may be a molded or cast polymer that is loaded or coated to be electrically-conductive.

In one particular embodiment, the gasket 100 is formed from beryllium copper alloy 25 ¼ hard having an initial thickness of 0.0035 inches, and which has undergone heat treating such that the diamond-pyramid hardness number (DPH) is about 353 or more using a 500 gram load. The beryllium copper alloy may be cleaned, and provided with a finish for galvanic compatibility (e.g., bright tin finish, etc.).

The washer 104 may also be formed from a wide range of materials. In various embodiments, the washer 104 is formed from type 301 stainless steel having a thickness about 0.075 inches. The dimensions set forth in this paragraph (as are all dimensions herein) are mere examples and can be varied as understood by those skilled in the art.

Accordingly, various embodiments provide gaskets (e.g., 100, etc.) that may be used in conjunction with chromatography devices. By way of background, chromatography devices are commonly used in analytical chemistry for separating complex mixtures of different molecules based on their physical properties (e.g., polarity and boiling point, etc.). As an example, chromatography units may be used in the oil industry for crude oil fingerprinting. To this end, FIGS. 12 through 14 illustrate the gasket 100 positioned circumferentially along and in electrical grounding contact with the interior surface 120 of the casting 108, which may have a surface roughness of about eighty grit sandpaper. By establishing an electrical grounding path from the PCB 112 to the casting's electrically-conductive interior surface 120, the gasket 100 establishes an electromagnetic shielding effect. It should be noted, however, that the casting 108 is shown only for purposes of illustration, as other embodiments may be used in a wide range of other devices, applications, and/or industries. Due to its unique construction and flexibility imparted thereby, gaskets of the present disclosure may be used in a wide range of applications, such as other castings, pipes, conduits, tubes, etc. Accordingly, the specific references to castings and chromatography herein should not be construed as limiting the scope of the present disclosure.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A gasket for providing electromagnetic interference (EMI) shielding and/or grounding of one or more electrical components on a substrate disposed within a passageway having a generally circular cross-section as defined by an electrically-conductive interior surface of a member, the gasket comprising:

inner and outer portions cooperatively defining a generally circular annular shape with a generally central opening;

the outer portion configured to be disposed circumferentially along and in electrical contact with the member's electrically-conductive interior surface in a first direction;

the inner portion configured to be disposed circumferentially along an edge portion of the substrate and in electrical contact with at least one electrically-conductive portion on the substrate in a second direction generally perpendicular to the first direction;

wherein the gasket includes a plurality of latch members circumferentially spaced-apart, and wherein the latch members are configured to be engagingly received and retained within corresponding circumferentially spaced-apart openings defined by a mounting component;

wherein the mounting component comprises a washer, wherein the washer and the member include corresponding fastener holes for receiving fasteners for attaching the washer to the member, and wherein the direction in which the fastener holes receive the fasteners is generally perpendicular to the first direction in which the gasket's outer portion electrically contacts the electrically-conductive interior surface of the member;

whereby the gasket establishes electrical grounding contact from the at least one electrically-conductive portion on the substrate to the member sufficient for EMI shielding applications.

2. The gasket of claim 1, wherein the direction by which the gasket is coupled to the member is generally perpendicular to the first direction in which the gasket's outer portion electrically contacts the electrically-conductive interior surface of the member.

3. A gas chromatography device comprising a casting having a passageway with a generally circular cross-section as defined by an electrically-conductive interior surface of the casting, a generally circular printed circuit board disposed within the passageway, and the gasket of claim 1, wherein the gasket outer portion is in electrical contact with the electrically-conductive interior surface of the casting, and wherein the gasket's inner portion is in electrical contact with at least one electrically-conductive portion on the generally circular printed circuit board.

4. The gasket of claim 1, further comprising resilient finger elements having contact portions for electrically contacting the electrically-conductive surface at corresponding circumferentially-spaced apart locations.

5. The gasket of claim 4, wherein the gasket includes a plurality of slots defining the resilient finger elements.

6. The gasket of claim 4, wherein a portion of the gasket is curved such that the contact portions have an arcuate transverse profile.

7. The gasket of claim 1, wherein the inner portion varies in height relative to the outer portion.

8. The gasket of claim 1, wherein the inner portion is crenulated.

9. The gasket of claim 1, wherein the gasket comprises a resilient flexible electrically-conductive material.

10. The gasket of claim 1, wherein the gasket's outer portion electrical contacts the member's electrically-conductive interior surface in a radial direction relative to the generally circular cross-section of the passageway; and wherein the gasket's inner portion electrically contacts at least one electrically-conductive portion on the substrate in an axial direction relative to the generally circular cross-section of the passageway.

11. A gasket for providing electromagnetic interference (EMI) shielding and/or grounding of one or more electrical components on a substrate disposed within a passageway having a generally circular cross-section as defined by an electrically-conductive interior surface of a member, the gasket comprising:

inner and outer portions cooperatively defining a generally circular annular shape with a generally central opening;

the outer portion configured to be disposed circumferentially along and in electrical contact with the member's electrically-conductive interior surface in a first direction;

the inner portion configured to be disposed circumferentially along an edge portion of the substrate and in electrical contact with at least one electrically-conductive portion on the substrate in a second direction generally perpendicular to the first direction;

wherein the gasket includes a transverse profile comprising:

an arcuate contact portion for electrically contacting the electrically-conductive surface;

a first slanted portion extending from the arcuate contact portion;

a first generally flat portion extending from the first slanted portion such that an acute angle is defined generally between the first slanted portion and the first generally flat portion;

a second generally flat portion extending generally perpendicularly from the first generally flat portion;

a second slanted portion extending from the second generally flat portion such that an obtuse angle is defined generally therebetween; and an engagement portion extending outwardly from the second generally flat portion intermediate the first generally flat portion and the second slanted portion, the engagement portion configured for engaging a corresponding opening of a mounting component to thereby mount the gasket to the mounting component.

12. The gasket of claim 11, wherein the gasket includes a plurality of latch members circumferentially spaced-apart, and wherein the latch members are configured to be engagingly received and retained within corresponding circumferentially spaced-apart openings defined by a mounting component.

13. The gasket of claim 12, wherein the mounting component comprises a washer, wherein the washer and the member include corresponding fastener holes for receiving fasteners for attaching the washer to the member, and wherein the direction in which the fastener holes receive the fasteners is generally perpendicular to the first direction in which the gasket's outer portion electrically contacts the electrically-conductive interior surface of the member.

14. An assembly for providing EMI shielding and/or grounding for one or more electrical components on a generally circular printed circuit board (PCB) associated with a gas chromatography unit, the gas chromatography unity including a casting having an electrically-conductive interior surface defining a passageway with a generally circular cross-section in which the PCB is disposed, the assembly comprising:

a gasket having latch members and inner and outer portions, the inner and outer portions cooperatively defining a generally circular annular shape with a generally central opening through which at least a portion of the PCB is accessible, the outer portion disposed circumferentially along and in electrical contact with the electrically-conductive interior surface of the casting in a radial direction, the inner portion disposed circumferentially along an edge portion of the PCB and in electrical contact with at least one electrically-conductive portion on the PCB in an axial direction generally perpendicular to the radial direction;

a washer including openings configured for engagingly receiving and retaining therein the latch members of the gasket for attaching the gasket to the washer, the washer further including fastener holes for receiving fasteners for attaching the washer to the casting, wherein the fastener holes receive the fasteners in an axial direction generally perpendicular to the radial direction;

whereby the gasket establishes electrical grounding contact from the at least one electrically-conductive portion on the PCB to the electrically-conductive interior surface of the casting.

15. The assembly of claim 14, wherein the gasket includes resilient finger elements having contact portions for electrically contacting the electrically-conductive interior surface at circumferentially-spaced apart locations.

16. The gasket of claim 15, wherein the gasket includes a plurality of slots defining the resilient finger elements.

17. A method for providing EMI shielding and/or grounding for one or more electrical components on a printed circuit board (PCB) within a passageway having a generally circular cross-section as defined by an electrically-conductive interior surface of a member, the method comprising mounting a gasket to a washer including engaging latching members of the gasket with corresponding openings of the washer, mounting the washer to the casting, positioning the gasket within the passageway relative to the PCB such that resilient finger elements of the gasket electrically contact the member's electrically-conductive interior surface in a first direction, and such that an inner portion of the gasket electrically contacts at least one electrically-conductive portion on the PCB in a second direction generally perpendicular to the first direction, whereby the gasket establishes electrical grounding contact from the at least one electrically-conductive portion on the PCB to the member sufficient for EMI shielding applications.

18. The method of claim 17, wherein the gasket includes a generally circular annular shape with a generally central opening through which at least a portion of the PCB is accessible.

19. The method of claim 17, wherein mounting the washer to the casting includes inserting fasteners within fastener holes of the washer and the casting in a direction generally perpendicular to the first direction in which the gasket electrically contacts the electrically-conductive interior surface of the casting.

20. The method of claim 19, wherein the first direction is a radial direction relative to the generally circular cross-section of the passageway, and wherein the second direction is an axial direction relative to the generally circular cross-section of the passageway.

* * * * *